(12) United States Patent
Mori et al.

(10) Patent No.: US 7,460,419 B2
(45) Date of Patent: Dec. 2, 2008

(54) NONVOLATILE SEMICONDUCTOR STORING DEVICE AND BLOCK REDUNDANCY SAVING METHOD

(75) Inventors: Yasumichi Mori, Ikoma (JP); Masahiko Watanabe, Kohriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 72 days.

(21) Appl. No.: 10/589,101

(22) PCT Filed: Feb. 9, 2005

(86) PCT No.: PCT/JP2005/001891

§ 371 (c)(1), (2), (4) Date: May 9, 2007

(87) PCT Pub. No.: WO2005/076283

PCT Pub. Date: Aug. 18, 2005

(65) Prior Publication Data

US 2007/0279984 A1 Dec. 6, 2007

(30) Foreign Application Priority Data

Feb. 10, 2004 (JP) ............................ 2004-033916

(51) Int. Cl.
*G11C 29/00* (2006.01)
*G11C 7/00* (2006.01)

(52) U.S. Cl. .................. 365/200; 365/201; 365/230.03; 365/185.09

(58) Field of Classification Search .................. 365/200, 365/201, 230.03, 185.09
See application file for complete search history.

(56) References Cited

U.S. PATENT DOCUMENTS

| 5,574,688 | A  | * | 11/1996 | McClure et al. ............. 365/200 |
| 6,178,127 | B1 | * | 1/2001  | Haraguchi .................. 365/200 |
| 6,418,066 | B1 |   | 7/2002  | Hidaka |
| 6,590,814 | B1 | * | 7/2003  | Kwak ......................... 365/200 |
| 6,888,764 | B2 | * | 5/2005  | Shiga et al. ................. 365/200 |
| 2002/0105840 | A1 | | 8/2002 | Ikeda et al. |

FOREIGN PATENT DOCUMENTS

| JP | 53-000032 A | 1/1978 |
| JP | 62-226500 A | 10/1987 |
| JP | 10-79482 A  | 3/1998 |
| JP | 11-086600 A | 3/1999 |

(Continued)

*Primary Examiner*—Richard Elms
*Assistant Examiner*—Toan Le
(74) *Attorney, Agent, or Firm*—Morrison & Foerster LLP (57) ABSTRACT

A nonvolatile semiconductor storing device according to the present invention comprises a block replacing means for replacing a defective block with a redundant block when a memory block in a memory array is the defective block. The block replacing means includes an address translation circuit 10 for converting an inputted external block address into an internal block address by inverting an address bit corresponding to dissident of each address bit between a defective block address of the defective block and a redundant block address among address bits of the inputted external block address, and each of the memory blocks 5 is selected based on the internal block address after the translation of the external block address inputted from outside by the address translation circuit 10.

11 Claims, 8 Drawing Sheets

FOREIGN PATENT DOCUMENTS

| | | |
|---|---|---|
| JP | 2000-182390 A | 6/2000 |
| JP | 2001-256793 A | 9/2001 |
| JP | 2003-045196 A | 2/2003 |
| JP | 2003-323352 A | 11/2003 |
| WO | WO-2005/076283 A1 | 8/2005 |
| WO | WO 2005/088703 A1 | 9/2005 |

* cited by examiner

NONVOLATILE SEMICONDUCTOR STORING DEVICE AND BLOCK REDUNDANCY SAVING METHOD

CROSS-REFERENCE TO RELATED APPLICATIONS

This application is a National Phase filing under 35 U.S.C. § 371 of International Application No. PCT/JP2005/001891 filed on Feb. 9, 2005, and which claims priority to Japanese Patent Application No. 2004-033916 filed on Feb. 10, 2004.

TECHNICAL FIELD

The present invention relates to a redundancy saving technique for a defective memory cell of a nonvolatile semiconductor storing device and more particularly, to a redundancy saving technique that can be applied to a nonvolatile semiconductor storing device having a dual work function or a boot block.

BACKGROUND ART

Similar to a redundancy saving technique for a defective memory cell of a nonvolatile storing device and a volatile semiconductor storing device such as a DRAM, various kinds of methods have been proposed and implemented. As a generally used redundancy saving technique, there is a method in which a defective row or a defective column containing a defective memory cell in a memory cell array, or a totally defective row or column is replaced with a redundant row or a redundant column that is prepared in some numbers in the vicinity of the memory cell array previously. In this case, a defective row address and a defective column address are stored in defective address storing means, and the stored defective row address and defective column address are compared with an address transmitted from outside and when they coincide with each other, a redundant row or a redundant column is automatically selected.

Although the row or column saving is an effective saving method when a defective mode is generated by the memory cell unit or in a row direction or a column direction, the row or the column that can be saved is limited depending on the number of the redundant rows or the redundant columns. Thus, the above saving is not effective in a multi-bit sequential defects (a plurality of defective memory cells become defective in sequential block) due to a particle, which is more frequently generated as a manufacturing process is miniaturized.

Thus, there is a block redundancy saving method in which a memory block including a certain unit of memory cells is saved in block. The above block redundancy saving method can effectively save the multi-bit sequential defect due to the particle and the like, so that a manufacturing yield can be improved.

Here, as a method for converting a defective address to a redundant address that can be applied to the block redundancy saving method, there is an address translation method proposed in a "semiconductor integrated circuit device" disclosed in Patent Document 1. According to the address translation method, a memory section having a memory cell array in which memory cell array columns having capacity exceeding capacity of a range selected by an address are arranged and an address translation circuit converting an address and selecting a memory cell of the memory section are provided, and correspondent relation between addresses and memory cell columns are fixed so that the address translation circuit replaces memory cell columns a number of which is more than defective memory cell columns including defective memory cell columns with the other normal memory cell columns. That is, an address translation pattern is fixedly stored by a fuse, so that it becomes not necessary to confirm coincidence or dissidence of the defective address every time an address is inputted. However, according to the address translation method, since row or column saving is assumed originally, when a plurality of redundant rows or redundant columns are to be related to a plurality of redundant blocks, a plurality of defective memory blocks can be saved at high speed without using address comparing means, however in this case, it is necessary to mount many redundant blocks on a chip previously, or a block that is not used is generated in a normal memory block, causing actual usage efficiency to be lowered and a memory bit cost to be increased.

Patent Document 1: Japanese Unexamined Patent Publication No. 2001-256793

DISCLOSURE OF INVENTION

Problems to be Solved by the Invention

In addition to the above problem, as a problem of an address translation at the time of block saving, there is a problem in a dual work function. The dual work function is a function in which while a reading operation is performed from one of two memory regions, a write operation (program or erase) is performed in the other in the same nonvolatile semiconductor storing device. According to the nonvolatile semiconductor storing device such as a flash memory, there are two kinds, that is, just data and a program code and when both are stored as contents of stored data, it needs to read the program code from a certain memory region in one nonvolatile semiconductor storing device while an external processor carries out a predetermined process, and to store processed data in the same nonvolatile semiconductor storing device. Thus, the dual work function is required in the nonvolatile semiconductor storing device in order to effectively carry out the above processes.

Meanwhile, the dual work function in a large-capacity nonvolatile semiconductor storing device can be implemented by dividing memory array into a plurality of partitions, constituting such that each partition includes a plurality of memory blocks and while a write operation in one memory block in the partition, a reading operation can be performed from one memory block in another partition.

In the case of the memory array constitution having the above dual work function, when it is assumed that each memory block can be saved in block freely, since a defective block is replaced with a redundant block beyond a boundary of the partitions, the unit of the partition cannot be maintained, so that the dual work function is destroyed.

The present invention was made in view of the above problems and it is an object of the present invention to provide a nonvolatile semiconductor storing device and a block redundancy saving method in which the above problems are solved and actual usage efficiency of a memory block is high, a dual work function can be applied, and a block saving process can be performed at high speed.

Means for Solving the Problem

In order to attain the above object, a nonvolatile semiconductor storing device according to the present invention characterized as a first aspect comprises a memory array including a plurality of memory blocks that consists of nonvolatile memory cells arranged in the form of an array in which program and erase operations can be electrically performed and can be erased in block and a redundant block having the same number of memory cells and the same constitution as that of one of the memory blocks, a block replacing means for replacing a defective block with the redundant block in a case where one of the memory blocks in the memory array is the defective block, wherein, the block replacing means includes an address translation circuit for converting an inputted external block address into an internal block address by inverting an address bit corresponding to dissidence of each address bit between a defective block address of the defective block and the redundant block address among address bits of the inputted external block address, and each of the memory blocks is selected based on the internal block address after the translation of the external block address inputted from outside by the address translation circuit.

According to the nonvolatile semiconductor storing device of the present invention including the above first aspect, when the external block address transmitted to the address translation circuit is the defective block address, since the internal block address to be outputted is converted to the redundant block address, a block replacement process in which the defective block is replaced with the redundant block is automatically performed. That is, since it is not necessary to determine whether the external block address from outside is the defective block address or not, the block replacement process can be carried out at high speed. In addition, since the block replacement process can be carried out for one redundant block, actual usage efficiency of the memory region can be highly maintained as a whole of the memory array. Furthermore, for the memory block other than the defective block, address translation from the external block address to the internal block address is performed, so that even when the plurality of memory blocks constitute a partition as a process unit of the dual work function, since an address bit for specifying the partition in the external block address is translated to the address bit of another internal block address according to the same rule. Therefore, since the memory block belonging to a certain partition also belongs to the same partition after the translation process, the process unit of the dual work function is not destroyed by the address translation process. In addition, when there is no defective block, since there is no address bit that does not coincide by setting the defective block address so as to be equal to the redundant block address, the external block address inputted to the address translation circuit is equal to the internal block address to be outputted, so that the memory block is normally selected.

In addition to the first aspect, the nonvolatile semiconductor storing device according to the present invention is characterized as a second aspect in that a particular block address of one particular memory block in the memory array is overlapped with a redundant block address of the redundant block, the block replacing means includes a particular block address detection circuit for detecting whether the block address inputted from outside is the particular block address or not, and outputting a signal for forcibly selecting the particular memory block when the block address coincides with the particular block address.

According to the nonvolatile semiconductor storing device of the present invention including the second aspect, when there is no defective block, since the address translation process is not substantially performed by the address translation circuit by setting the defective block address so as to be equal to the redundant block address. Thus, when the particular block address (the same as the redundant block address) is inputted from outside, not the redundant block but the particular memory block is selected. In addition, in the case where the defective block exists, when the defective block address is inputted, the address translation circuit converts it to the redundant block address, and the redundant block is selected, and when the particular block address is inputted, although the address translation circuit converts it to the defective block address, the particular block address detection circuit does not select the defective block but selects the particular memory block. Here, although a time taken for the coincidence detection process of the particular block address detection circuit is to be considered, since the coincidence detection process can be carried out in parallel to the address translation process of the address translation circuit, it does not become a factor delaying the block replacement process, so that a high speed process can be maintained.

Furthermore, when the defective block exists, although the memory blocks other than the particular memory block is replaced with another memory block arranged at the position different from the originally specified position by the address translation process determined by the defective block address, the particular memory block is surely selected when the particular block address is inputted. Therefore, since a physical relation between the particular block address and the particular memory block can be maintained after the address translation process, the particular memory block can be distinguished by a structure different from other memory blocks, and can be used for a specific usage.

In addition to the second aspect, the nonvolatile semiconductor storing device according to the present invention is characterized as a third aspect in that the particular memory block is a boot block constituted by a plurality of small memory blocks allowing data to be erased in block.

In addition, according to the nonvolatile semiconductor storing device of the present invention including the third aspect, when the particular block address is inputted, since the particular memory block that is the boot block is surely selected, the particular memory block can be distinguished from the other memory blocks and can be used as the boot block regardless of whether the defective block exists or not.

In addition to the third aspect, the nonvolatile semiconductor storing device according to the present invention is characterized as a fourth aspect in that a body part of the memory array includes the redundant block and the memory blocks other than the boot block, and the boot block is disposed away from the memory array body part.

According to the nonvolatile semiconductor storing device of the present invention including the fourth aspect, since the redundant block is constitutionally the same as the memory block except for the boot block, the memory blocks can be regularly arranged and an extra space is not generated in the memory array body part. In addition, according to the boot block, by adjusting the layout in the vicinity of the memory array, the extra space existing in the vicinity thereof can be effectively used. As a result, since a mounting density of the whole memory array is improved, and a chip size of the entire device can be miniaturized, so that a manufacturing cost can be reduced.

In addition to any one of the above second to fourth aspects, the nonvolatile semiconductor storing device according to the present invention is characterized as a fifth aspect in that the particular block address is a most significant or least significant address of the block addresses.

According to the nonvolatile semiconductor storing device of the present invention including the fifth aspect, the particular block address can be easily identified, so that the particular memory block can be used separately from other memory blocks. In addition, compatibility with a general boot block memory can be maintained.

In addition to any one of the above first to fifth aspects, the nonvolatile semiconductor storing device of the present invention is characterized as a sixth aspect in that the block replacing means includes a defective block address memory circuit for storing information regarding the defective block address or dissidence of each address bit between the defective block address and the redundant block address, and the address translation circuit includes one of an exclusive NOR circuit and an exclusive OR circuit for each address bit of the block address.

According to the nonvolatile semiconductor storing device of the present invention including the sixth aspect, the block replacing means according to the first aspect can be concretely implemented with the simple circuit constitution.

In addition to the sixth aspect, the nonvolatile semiconductor storing device of the present invention is characterized as a seventh aspect in that the defective block address memory circuit is writable from outside.

According to the nonvolatile semiconductor storing device including the seventh aspect, even when a normal memory block becomes the defective block for some reason after it is shipped as a non-defective product in which there is no defect and mounted in a specific device, by writing a new defective address in the defective block address memory circuit, the redundancy saving of the defective block can be implemented ex post facto. Therefore, reliability of the final product can be more improved.

In addition to any of the above aspects, the nonvolatile semiconductor storing device according to the present invention is characterized as a eighth aspect in that the memory array is configured to be divided into a plurality of partitions each including the plurality of memory blocks, and during a write operation to a memory block in the partition, a reading operation to a memory block in another one of the partitions is allowed to be performed.

According to the nonvolatile semiconductor storing device of the present invention including the eighth aspect, the nonvolatile semiconductor storing device can include a dual work function in which the partition is a processing unit, and can use the dual work function also after the redundancy saving of the defective block.

In order to attain the above object of the present invention, a block redundancy saving method according to the present invention characterized as a first aspect is for a nonvolatile semiconductor storing device comprising a memory array including a plurality of memory blocks that consists of nonvolatile memory cells arranged in the form of an array in which program and erase operations can be electrically performed and can be erased in block and a redundant block having the same number of memory cells and the same constitution as that of one of the memory blocks. The method comprises an address translating step for converting an external block address inputted from outside into an internal block address by inverting an address bit corresponding to dissidence between a defective block address of the defective block and the redundant block address among address bits of the external block address inputted from outside; and a memory block selecting step for selecting the memory block using the internal block address.

According to the block redundancy saving method of the nonvolatile semiconductor storing device of the present invention including the above first aspect, when the external block address transmitted from outside is the defective block address, since the translated internal block address becomes the same as the redundant block address, a block replacement process in which the defective block is replaced with the redundant block is automatically performed. That is, since it is not necessary to determine whether the external block address from outside is the defective block address or not, the block replacement process can be carried out at high speed. In addition, since the block replacement process at the block address translating step can be carried out for one redundant block, actual usage efficiency of the memory region can be highly maintained as a whole of the memory array. Furthermore, for the memory block other than the defective block, address translation from the external block address to the internal block address is performed, so that even when the plurality of memory blocks constitute a partition as a process unit of the dual work function, an address bit for specifying the partition in the external block address is translated to the address bit of another internal block address according to the same rule. Therefore, since the memory block belonging to a certain partition also belongs to the same partition after the translation process, the process unit of the dual work function is not destroyed by the address translation process. In addition, when there is no defective block, since there is no address bit that does not coincide by setting the defective block address so as to be equal to the redundant block address, the external block address inputted to the address translation circuit is equal to the internal block address to be outputted, so that the memory block is normally selected.

In addition to the first aspect, the block redundancy saving method of the nonvolatile semiconductor storing device according to the present invention is characterized as a second aspect in that a particular block address of one particular memory block in the memory array is overlapped with a redundant block address of the redundant block, whether the block address inputted from outside is the particular block address or not is detected, and the particular memory block is forcibly selected when the external block address coincides with the particular block address.

According to the block redundancy saving method of the nonvolatile semiconductor storing device of the present invention including the second aspect, when there is no defective block, since the address translation process is not substantially performed at the address translating step by setting the defective block address so as to be equal to the redundant block address. Thus, when the particular block address (the same as the redundant block address) is inputted from outside, not the redundant block but the particular memory block is selected. In addition, in the case where the defective block exists, when the defective block address is inputted, it is converted to the redundant block address at the block address translating step, and the redundant block is selected at the memory block selecting step, and when the particular block address is inputted, although it is converted to the defective block address at the block address translating step, the defective block is not selected but the particular memory block is forcibly selected. Here, although a time taken for the coincidence detection process between the block address transmitted from outside and the particular block address is to be considered, since the coincidence detection process can be carried out in parallel to the block address translating step, it does not become a factor delaying the block replacement process, so that a high speed process can be maintained.

Furthermore, when the defective block exists, although the memory blocks other than the particular memory block is replaced with another memory block arranged at the position different from the originally specified position by the address translation process determined by the defective block address, the particular memory block is surely selected when the particular block address is inputted. Therefore, since a physical relation between the particular block address and the particular memory block can be maintained after the address translation process, the particular memory block can be distinguished by a structure different from other memory blocks, and can be used for a specific usage.

EXPLANATION OF REFERENCES

1: Memory Array
2: Memory Array Body Part
3: Boot Block Part
4: Partition
5: Memory Block
6: Redundant Block
7: Memory Block
8: Main Column Decoder
10: Address Translation Circuit
11: Boot Block Detection Circuit (Particular block address Detection Circuit)
12: Defective Block Address Memory Circuit
13: Partition Decode Circuit
14: Block Decode Circuit
15: Partition Selection Circuit
16: Boot Block Selection Circuit
17, 18: Control Circuit
19: 2-input Exclusive NOR Circuit
Sbb: Boot Block Selection Signal
PSEL0 to 7: Partition Selection Signal
BSEL0 to 3: Block Selection Signal

BEST MODE FOR CARRYING OUT THE INVENTION

One embodiment of a nonvolatile semiconductor storing device and a block redundancy saving method according to the present invention (referred to as the "device of the present invention" and the "method of the present invention" occasionally hereinafter) will be described with reference to the drawings hereinafter. The following description will be made assuming that the device of the present invention is a boot block type of flash memory including a dual work function.

According to the device of the present invention, since its functional block constitution as a whole is similar to that of a conventional boot block type of flash memory including a general dual work function, a description for each function block (an address input circuit, an address decoder circuit, a data input/output circuit, a data program and erase circuit, a peripheral circuit such as a control circuit for controlling read and write of data, and the like) will be omitted, and a circuit constitution or method specific to the device and method of the present invention will be described.

Figure 1:
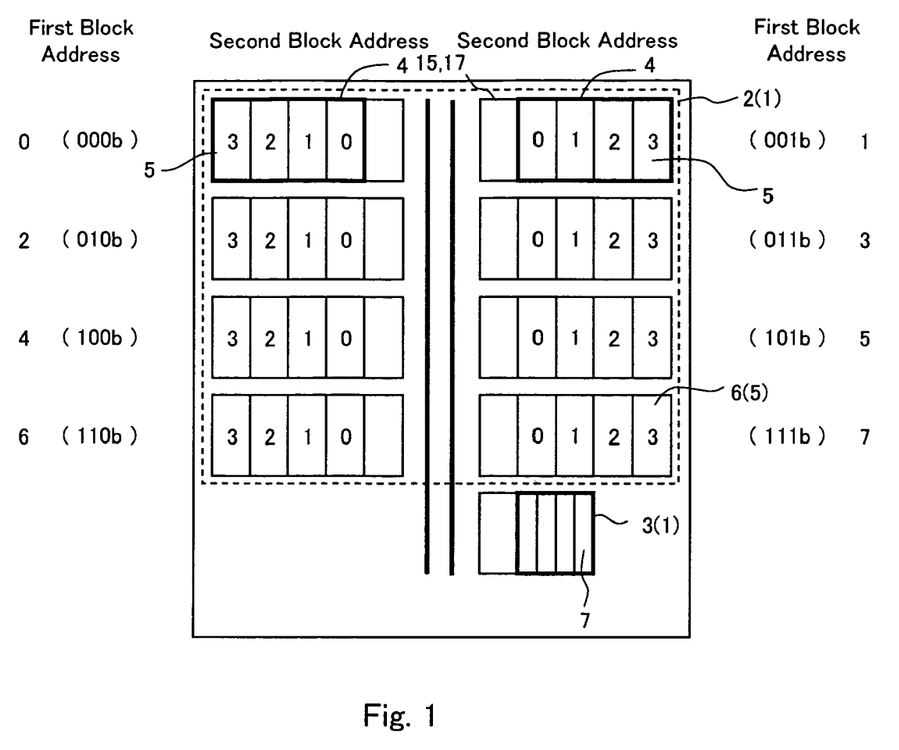
FIG. 1 is a block diagram schematically showing a memory array constitution according to one embodiment of a nonvolatile semiconductor storing device of the present invention.

FIG. 1 is a schematic view showing a memory array constitution of the device of the present invention. According to this embodiment, a memory array 1 includes a memory array body part 2 and a boot block part 3 provided separately. The memory array body part 2 is uniformly divided into a plurality of partitions 4 (eight partitions in the example shown in FIG. 1), and each partition 4 is uniformly divided into four memory blocks 5. Each memory block 5 is constituted such that memory cells are arranged in plural lines in the form of an array. According to this embodiment, a flash cell including a flash memory transistor having a floating gate structure is assumed as a memory cell, and each memory block 5 is the data erase unit.

Since the total number of memory blocks in the memory array body part 2 is 32 in the block constitution example shown in FIG. 1, the block addresses required to select each of the memory blocks from the memory array body part 2 is 5-bit address. In the address bits, three high-order bits are defined as a first block address for selecting a partition and two low-order bits are defined as a second block address for selecting one of four memory blocks 5 in each of the partitions 4. In addition, the number of partitions in the memory array body part 2 and the number of blocks in the partition 4 show one example, and the present invention is not limited to the example of this embodiment.

According to this embodiment, the most significant address (1 1 1 1 1) of the block address is defined as a particular block address and a memory block corresponding to the particular block address is set to a redundant block 6. In addition, the boot block part 3 (corresponding to the particular memory block) provided separately from the memory array body part 2 is allotted to that particular block address. As will be described below, when the particular block address "1 1 1 1 1" is inputted from outside, it is so constituted that the boot block part 3 is selected instead of the redundant block 6. That is, the partition physically including the redundant block is so constituted that it logically includes the boot block. Its detailed circuit constitution will be described below.

Although the boot block part 3 has the same total number of memory cells as that of the memory block 5 of the memory array body part 2, it further includes a plurality of divided small memory blocks 7 and each small memory block 7 can be erased in block. Since the boot block part 3 needs to comprise the small memory blocks 7 separated from each other, its area is larger than that of the memory block 5 of the memory array body part 2. Thus, when the boot block part 3 is contained in the memory array body part 2, an extra space is generated in the memory array body part 2. Meanwhile, according to this embodiment, such inconvenience is appropriately avoided.

Figure 2:
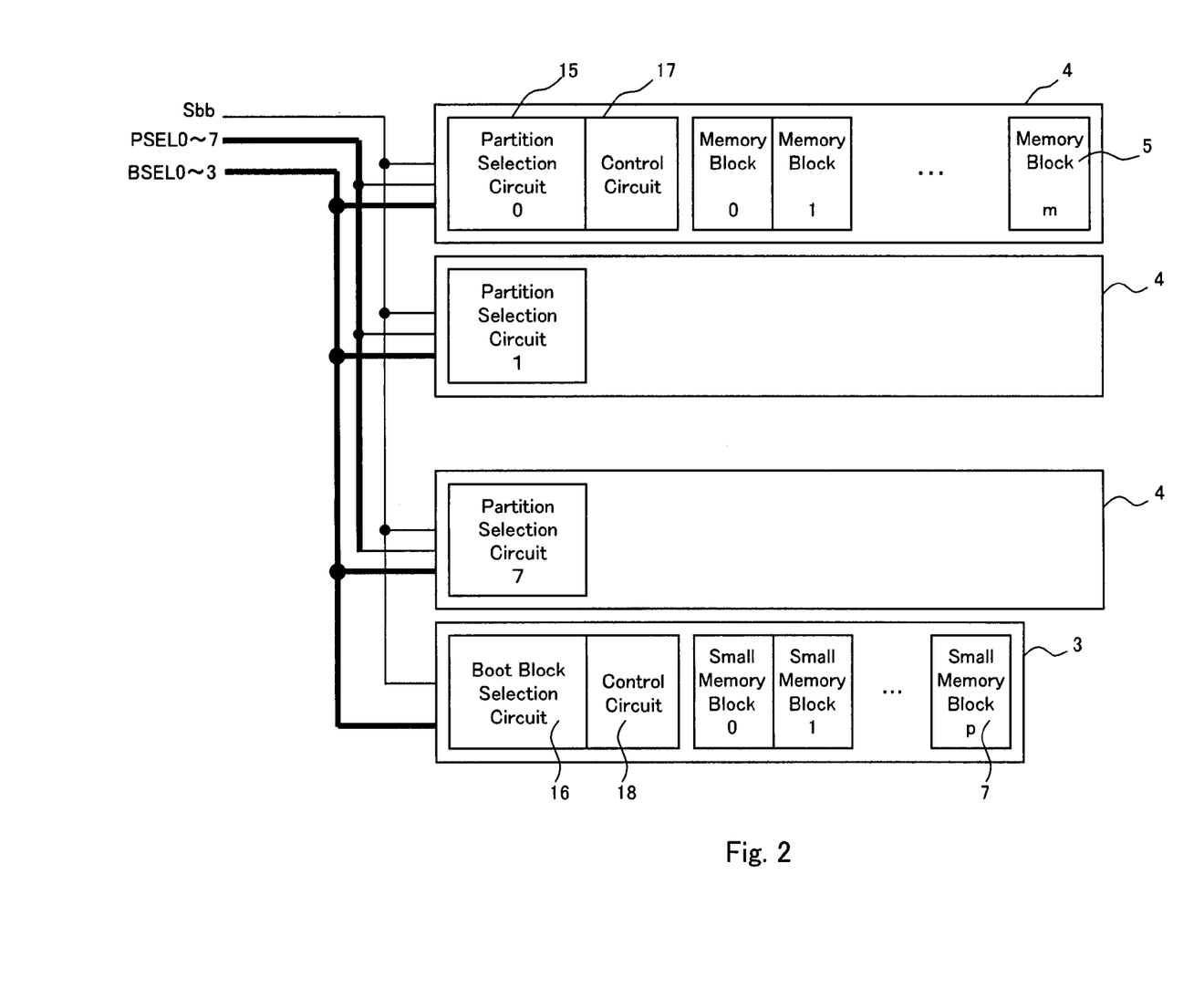
FIG. 2 is another block diagram schematically showing a memory array constitution according to one embodiment of the nonvolatile semiconductor storing device of the present invention.

As shown in FIG. 1, in the memory array body part 2, the four partitions 4 are arranged on each side and signal lines (an address signal, a data signal, various kinds of control signals, for example) required for a memory operation (read, program, and erase of data and the like) are arranged in the center. In FIG. 1, a selection circuit of the partition 4 and a control circuits (various kinds of decoder circuits, read circuit, program and erase circuit and the like) required for the memory operation are arranged in each partition 4 on the center side. The specific arrangement is as shown in FIG. 2. Referring to FIG. 2, there is provided a hierarchical bit line structure in which a global bit line is arranged so as to cross the plurality of memory blocks in the lateral direction, a local bit line is provided in each memory block in a column direction (lateral direction in FIG. 2), a drain electrode of a flash cell in the same column in each memory block is connected to a common local bit line, and the local bit line is connected to the global bit line through a predetermined bit line selecting transistor. According to the above constitution, various kinds of memory operations from the control circuit 17 can be carried out for the selected memory cell through each bit line. In addition, a word line is provided in row direction (vertical direction in FIG. 2) although it is not shown, a gate electrode of the flash cell in the same row in the memory block is connected to the common word line and the memory cell can be selected in the row direction by the selected word line. The boot block part 3 has a constitution basically similar to each partition 4, and a control circuit 18 required for the memory operation is provided similar to each partition 4.

A description will be made of a block replacement process according to the method of the present invention in which when one of the memory blocks 5 ("0 0 0 0 0" to "1 1 1 1 0") in the memory array body part 2 is a defective block that requires block redundancy saving, it is replaced with the redundant block 6 having an redundant block address "1 1 1 1 1".

Figure 3:
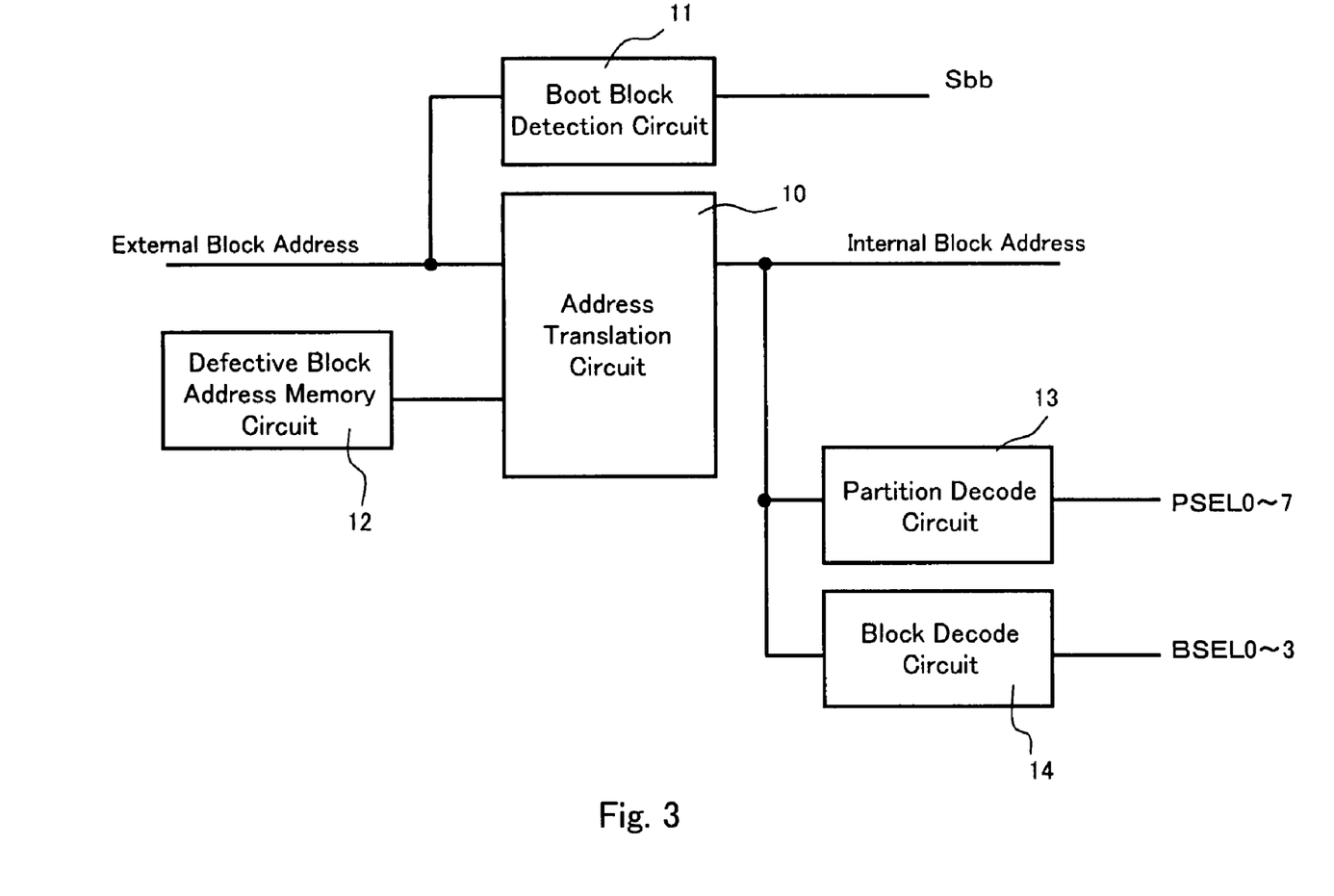
FIG. 3 is a block diagram showing a circuit constitution regarding a block replacement process according to one embodiment of the nonvolatile semiconductor storing device of the present invention.

First, a description will be made of a circuit constitution regarding the block replacement process. As shown in FIG. 3, an external block address transmitted from outside is inputted to an address translation circuit 10 and a boot block detection circuit 11 (corresponding to a particular block address detection circuit). The boot block detection circuit 11 outputs a boot block selection signal Sbb at a predetermined signal level (high level, for example) when the external block address is the particular block address of the most significant address "1 1 1 1 1".

The address translation circuit 10 converts the inputted external block address into an internal block address by inverting an address bit of the inputted external block address corresponding to dissidence between the redundant block address (1 1 1 1 1) and a 5-bit defective block address outputted from a defective block address memory circuit 12 in which states (1 or 0) of each address bit of the defective block address are stored, and outputs the internal block address.

In the internal block address converted by the address translation circuit 10, the high-order three bits of the first block address are sent to a partition decode circuit 13 and eight partition selection signals PSEL0 to 7 are outputted. One of the partition selection signals PSEL0 to 7 outputs a predetermined selection level (high level, for example) according to a value of the first block address, and the other seven selection signals output an unselection level (low level, for example). The low-order two bits of the internal block address of the second block address are inputted to a block decode circuit 14 and four block selection signals BSEL0 to 3 are outputted.

As shown in FIG. 2, the boot block selection signal Sbb generated in the boot block detection circuit 11, the partition selection signals PSEL0 to 7 generated in the partition decode circuit 13, and the block selection signals BSEL0 to 3 generated in the block decode circuit 14 are inputted to the partition selection circuit 15 and the boot block selection circuit 16 of each partition. In addition, among the partition selection signals PSEL0 to 7, only one signal is inputted to the corresponding partition selection circuits 15. When the boot block selection signal Sbb is at high level, all partition selection circuits 15 become an unselected state regardless of the states of the partition selection signals PSEL0 to 7, so that the boot block selection signal Sbb is activated and becomes a selected state.

According to this embodiment, as described above, the block replacing means for implementing the block replacement process consists of the address translation circuit 10, the boot block detection circuit 11 and the defective block address memory circuit 12.

Next, a description will be made of a constitution of the address translation circuit 10 and an algorithm of the address translation process and a memory block selecting method after the address translation process according to the method of the present invention.

Figure 4:
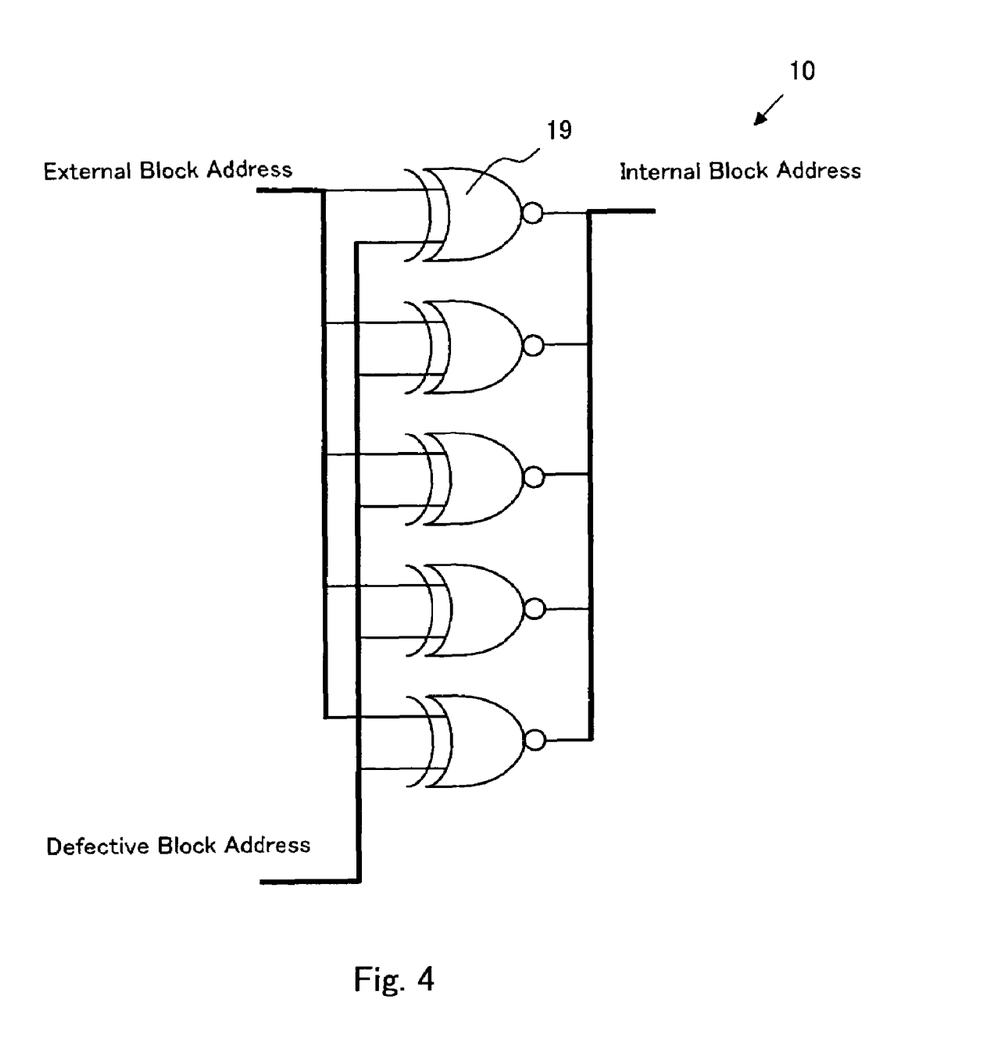
FIG. 4 is a logic circuit diagram showing an address translation circuit according to one embodiment of the nonvolatile semiconductor storing device of the present invention.

As shown in FIG. 4, the address translation circuit 10 includes five 2-input exclusive NOR circuits 19 logically. To each exclusive NOR circuit 19, one address bit of the external block address and one address bit of a corresponding defective block address are inputted. According to the exclusive NOR process, when two inputted values (0 or 1) coincide with each other, "1" is outputted and when they do not coincide, "0" is outputted. Since the redundant block address is "1 1 1 1 1" in this embodiment, the address bit whose value is 0 in the defective block address corresponds to the part that is dissident from the redundant block address. Therefore, each address bit of the external block address corresponding to the address bit whose value is 0 in the defective block address is inverted, that is, converted to the internal block address through the above exclusive NOR process. Namely, when the address bit of the external block address is 1, 0 is outputted and when it is 0, 1 is outputted. Contrary, the address bit whose value is 1 in the defective block address is not inverted and that address bit of the external block address is outputted as it is as the internal block address.

For example, in a case where the defective block address is "0 1 0 0 1", the second, third and fifth bits of the defective block address from the least significant bit are inverted, so that the internal block address becomes "1 1 1 1 1". Therefore, when the defective block address "0 1 0 0 1" is inputted as the external block address to the address translation circuit 10, the internal block address "1 1 1 1 1" is outputted. Thus, the internal block address "1 1 1 1 1" is inputted to the partition decode circuit 13 and the block decode circuit 14 and the redundant block of the block 3 of the partition 7 is selected.

Next, an address translation process by the exclusive NOR process for all of the block addresses will be verified. Here, the first block address of the high-order three bits and the second block address of the low-order two bits are separated to be considered.

Figure 5:
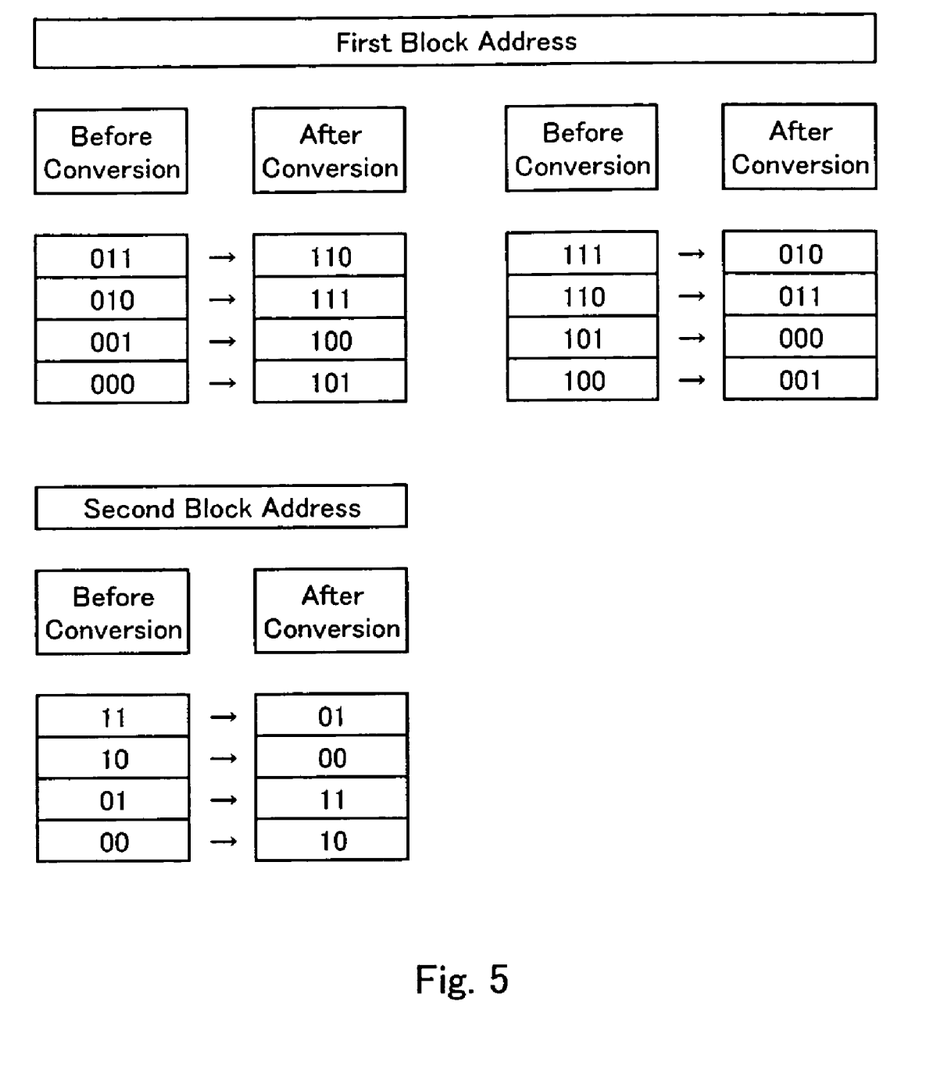
FIG. 5 is an address translation table showing a concrete example of an address translation process according to one embodiment of a block redundancy saving method of the nonvolatile semiconductor storing device of the present invention.

As shown in a translation table in FIG. 5, for all of the eight partitions, a pair of partitions is formed and translation is performed for each pair. Similarly, for all of the four blocks in the partition 4, a pair of blocks is formed and translation is performed for each pair. Which partitions are paired or which blocks are paired are determined by the defective block address. According to this embodiment, when the external block address A is translated to the internal block address B by the address translation circuit 10, since the external block address B is translated to the internal block address A, the external block address and the internal block address have a symmetrical relation.

Figure 6:
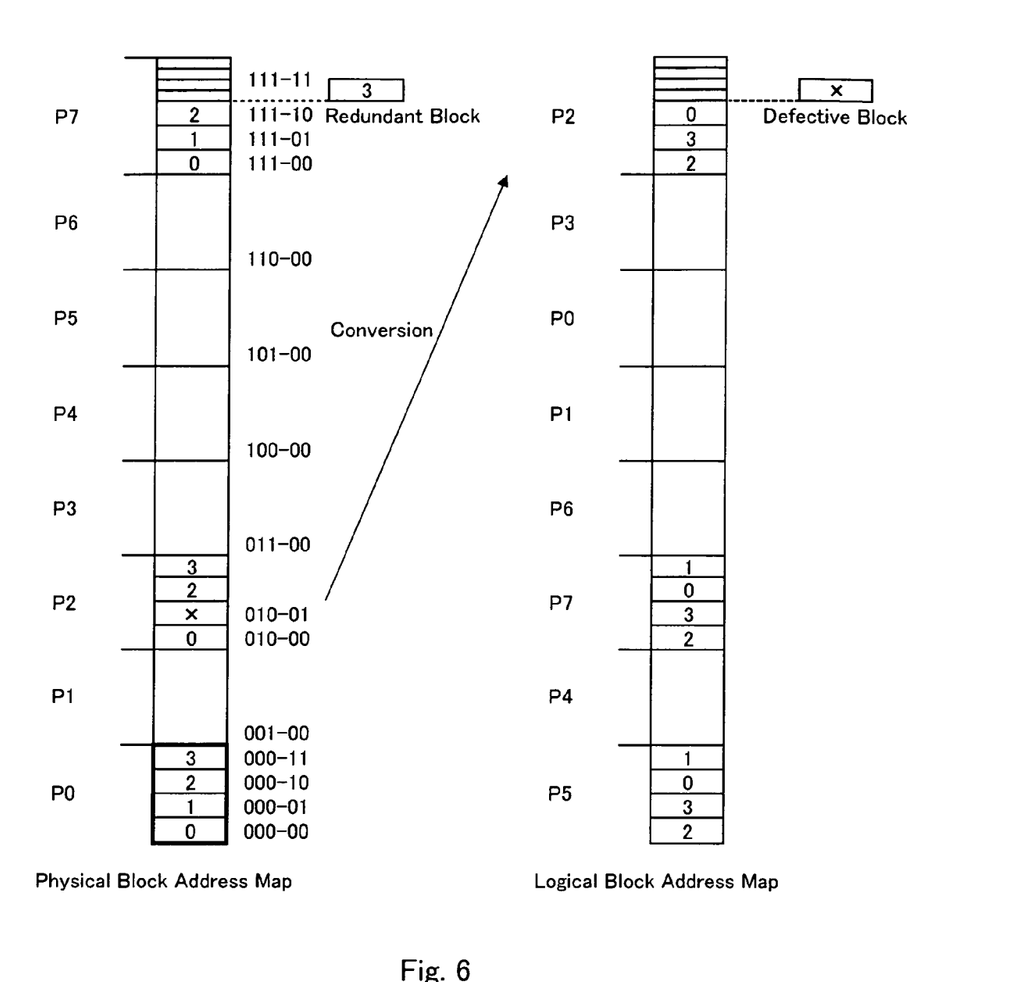
FIG. 6 is an address map showing a concrete example of an address translation process according to one embodiment of the block redundancy saving method of the nonvolatile semiconductor storing device of the present invention.

Here, since the partition is translated in block and the block address is translated in the partition, the memory block in the same partition is in the same partition after the translation. This is schematically shown in FIG. 6. In FIG. 6, a physical block address is treated as a block address physically corresponding to an actual arranged position of each memory block in the memory array. In addition, a logical block address map shown in FIG. 6 shows a corresponding relation between positions of the physical partition and the memory block and the translated logical block address, and shows that how arrangements of the physical partition and memory block are changed after the address translation process. In each block address map, the partition and the memory block having the same vertical position show physically the same substances. An arrow shown in FIG. 6 shows that even when a physical block address "0 1 0 0 1" showing the defective block is inputted, since the external block address is converted to the internal block address "1 1 1 1 1" by the address translation process, the redundant block positioned at the physical block address "1 1 1 1 1" is selected.

Figure 7:
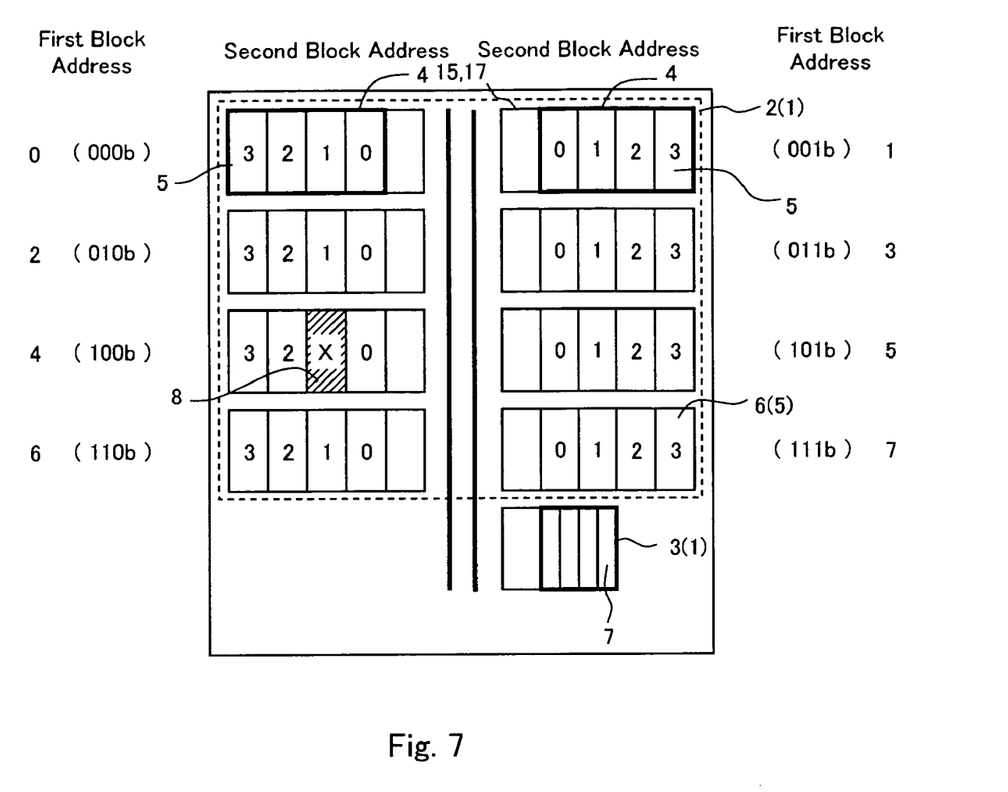
FIG. 7 is a block diagram schematically showing an example of a position of a defective block in the memory array constitution shown in FIG. 1.

The partition P2 that contains a defective block (hatched part in FIG. 7) in the physical block address map is treated as the partition P7 in the logical block address map, and contrary, the partition P7 containing the boot block logically in the physical block address map is treated as the partition P2 in the logic block address map. Therefore, when the "0 1 0" is inputted as the external block address (first block address), the partition P7 in an internal block address space (that is, in an actual memory array) is selected, and contrary, when "1 1 1" is inputted as the external block address (first block address), the partition P2 in the internal block address space is selected.

Each memory block in the partition is similarly translated by the address translation process. Here, when the defective block address "0 1 0 0 1" is inputted from outside, the redundant block of the block address "1 1 1 1 1" in the internal block address space is selected, so that the defective block is replaced with the redundant block. As a result, the defective block is saved by the redundant block. Contrary, when the particular block address "1 1 1 1 1" that selects the boot block part 3 is inputted from outside, although the defective block (refer to the hatched part in FIG. 7) of the block address "0 1 0 0 1" in the internal block address space is selected by the translation process, the boot block part 3 is not to be appropriately selected. Thus, as described above, when the particular block address "1 1 1 1 1" is inputted, the boot block detection circuit 11 forcibly selects the boot block part 3.

When there is no defective block, since the inversion process is not performed by the exclusive NOR process at all by setting the defective block to "1 1 1 1 1" that is the same as the redundant block address, the external block address is outputted as it is as the internal block address.

According to this embodiment, since the redundant block address is "1 1 1 1 1", the exclusive NOR process is performed, but when the redundant block address is "0 0 0 0 0", since the address bit whose value is "1" in the defective block address corresponds to a bit that is dissident from the bits of the redundant block address, not the exclusive NOR process but an exclusive OR process is suitable. However, according to the exclusive OR process, since the output of the exclusive NOR process may only be inverted, the exclusive NOR circuit or an exclusive OR circuit may be occasionally used in a concrete circuit constitution.

Here, according to the defective block address memory circuit 12 that outputs each address bit of the defective block address to the address translation circuit 10, for example, a pair of flash cells is allotted to each address bit, and by setting one to a high threshold voltage and the other to a low threshold voltage, a state (0 or 1) of each address bit can be stored by determining which flash cell is written in the high threshold voltage. In addition, when two flash cells are used for each address bit, the state of the address bit can be surely read out at a low current consumption.

Alternatively, one flash cell may be allotted to each address bit. In this case, by relating an erased state to the redundant block address, only the part that does not coincide may be written. According to the above constitution, the same address translation circuit 10 can be used without limiting to the case where the redundant block address is "1 1 1 1 1". In addition, when the address translation circuit 10 is based on the exclusive OR process, the part where the defective block address coincides with the redundant block address may be written in the flash cell. According to this constitution, when there is no defective block, it is not necessary to store the default defective block address in the defective block address memory circuit 12.

In addition, in above any constitution, it is preferable that write, or program and erase operation can be performed for the flash cell of the defective block address memory circuit 12 from outside. In this case, for example, the defective block address memory circuit 12 is set in a write mode when receives a specific command from outside and erase and write to each flash cell is carried out.

Figure 8:
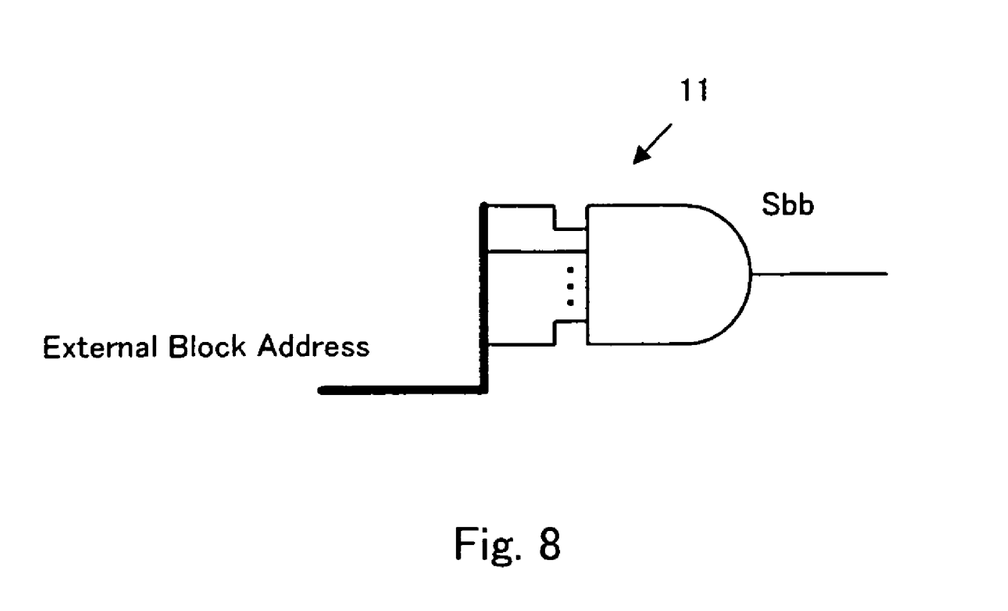
FIG. 8 is a logic circuit diagram showing one example of a boot block detection circuit according to one embodiment of the nonvolatile semiconductor storing device of the present invention.

Next, the boot block detection circuit 11 will be briefly described hereinafter. According to this embodiment, since the particular block address is "1 1 1 1 1", it can be easily constituted with a 5-input AND circuit logically as shown in FIG. 8. Each address bit of the external block address is inputted to each input thereof. In addition, when the particular block address is "0 0 0 0 0", the boot block detection circuit 11 can be easily constituted with a 5-input NOR circuit logically according to the same idea described above.

Next, another embodiment of the present invention will be described.

(1) Although it is assumed that the device of the present invention is the boot block type of flash memory including the dual work function in the above embodiment, the block replacement process by the address translation circuit 10 and the boot block detection circuit 11 according to the present invention, that is, the method of the present invention can be applied to a flash memory that does not include a dual work function, or a flash memory in which a particular block address is not a boot block.

(2) Although it is assumed that the particular block address is "1 1 1 1 1" in the above embodiment, the particular block address is not limited to the most significant address of the block address, it may be the least significant address or a middle address.

(3) Although the defective block address memory circuit 12 stores the defective block address in the above embodiment, when the particular block address is "1 1 1 1 1" or "0 0 0 0 0", since it is equivalent to storing the same or different part regarding the address bit of the redundant block address substantially, the address bit that agrees or disagree with the redundant block address may be stored.

(4) Although there is provided one memory array 1 including the memory array body part 2 including one redundant block 7 and the boot block part 3 in the above embodiment, the device of the present invention may include a plurality of memory arrays 1.

(5) Although the flash cell is assumed as the memory cell in the above embodiment, the memory cell is not limited to that. Furthermore, even when the memory cell is a variable resistive element type of memory cell such as a MRAM, an OUM, or a RRAM other than the one in which a difference in stored state appears as a difference in threshold voltage of a memory transistor, the block replacement process of the present invention can be applied to it. Furthermore, the idea of the block replacement process can be applied to another nonvolatile semiconductor storing device. Especially, it can be effectively applied to a nonvolatile semiconductor storing device including a dual work function or a boot block.

INDUSTRIAL APPLICABILITY

The present invention can be applied to a redundancy saving technique for a defective memory cell of a nonvolatile semiconductor storing device, and especially, it can be effectively applied to a nonvolatile semiconductor storing device including a dual work function or a boot block.

The invention claimed is:

1. A nonvolatile semiconductor storing device comprising:
a memory array including a plurality of memory blocks that consists of nonvolatile memory cells arranged in the form of an array in which program and erase operations can be electrically performed and can be erased in block and a redundant block having the same number of memory cells and the same constitution as that of one of the memory blocks; and
a block replacing means for replacing a defective block with the redundant block in a case where one of the memory blocks in the memory array is the defective block, wherein
the block replacing means includes an address translation circuit for converting an inputted external block address into an internal block address by inverting an address bit corresponding to dissidence of each address bit between a defective block address of the defective block and the redundant block address among address bits of the inputted external block address, and
each of the memory blocks is selected based on the internal block address after the translation of the external block address inputted from outside by the address translation circuit.

2. The nonvolatile semiconductor storing device according to claim 1, wherein
a particular block address of one particular memory block in the memory array is overlapped with a redundant block address of the redundant block, and
the block replacing means includes a particular block address detection circuit for detecting whether the block address inputted from outside is the particular block address or not and outputting a signal for forcibly selecting the particular memory block when the block address coincides with the particular block address.

3. The nonvolatile semiconductor storing device according to claim 2, wherein the particular memory block is a boot block constituted by a plurality of small memory blocks allowing data to be erased in block.

4. The nonvolatile semiconductor storing device according to claim 3, wherein a body part of the memory array includes the redundant block and the memory blocks other than the boot block, and
the boot block is disposed away from the memory array body part.

5. The nonvolatile semiconductor storing device according to claim 2, wherein the particular block address is a most significant or least significant address of the block addresses.

6. The nonvolatile semiconductor storing device according to claim 1, wherein
the block replacing means includes a defective block address memory circuit for storing information regarding the defective block address or dissidence of each address bit between the defective block address and the redundant block address, and
the address translation circuit includes one of an exclusive NOR circuit and an exclusive OR circuit for each address bit of the block address.

7. The nonvolatile semiconductor storing device according to claim 6, wherein the defective block address memory circuit is writable from outside.

8. The nonvolatile semiconductor storing device according to claim 1, wherein the memory array is configured to be divided into a plurality of partitions each including the plurality of memory blocks, and
during a write operation to a memory block in the partition, a reading operation to a memory block in another one of the partitions is allowed to be performed.

9. The nonvolatile semiconductor storing device according to claim 1, wherein the memory cell is a floating gate type of flash memory cell.

10. A block redundancy saving method for a nonvolatile semiconductor storing device comprising a memory array including a plurality of memory blocks that consists of nonvolatile memory cells arranged in the form of an array in which program and erase operations can be electrically performed and can be erased in block, and a redundant block having the same number of memory cells and the same constitution as that of one of the memory blocks, the method comprising:
an address translating step for converting an external block address inputted from outside into an internal block address by inverting an address bit corresponding to dissidence between a defective block address of the defective block and the redundant block address among address bits of the external block address inputted from outside; and
a memory block selecting step for selecting the memory block using the internal block address.

11. The block redundancy saving method according to claim 10, wherein
a particular block address of one particular memory block in the memory array is overlapped with a redundant block address of the redundant block, and
whether the external block address inputted from outside is the particular block address or not is detected, and the particular memory block is forcibly selected when the external block address coincides with the particular block address.

* * * * *